(12) United States Patent
Choi et al.

(10) Patent No.: US 10,820,434 B2
(45) Date of Patent: Oct. 27, 2020

(54) DISPLAY APPARATUS

(71) Applicant: SAMSUNG ELECTRONICS CO., LTD., Suwon-si (KR)

(72) Inventors: Dae Su Choi, Suwon-si (KR); Chul Soon Park, Seoul (KR); Woo Sung In, Hwaseong-si (KR); Hyun Jun Jung, Yongin-si (KR); Jong Hee Han, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 16/119,830

(22) Filed: Aug. 31, 2018

(65) Prior Publication Data

US 2019/0069422 A1    Feb. 28, 2019

(30) Foreign Application Priority Data

Aug. 31, 2017  (KR) .................. 10-2017-0111498

(51) Int. Cl.
*H05K 5/02* (2006.01)
*F16M 11/42* (2006.01)
*F16M 11/10* (2006.01)

(52) U.S. Cl.
CPC ......... *H05K 5/0234* (2013.01); *F16M 11/105* (2013.01); *F16M 11/42* (2013.01); *F16M 2200/041* (2013.01)

(58) Field of Classification Search
CPC .... H05K 5/0234; F16M 11/105; F16M 11/42; F16M 2200/041
See application file for complete search history.

(56) References Cited

U.S. PATENT DOCUMENTS

| 6,639,788 | B1 | 10/2003 | Liao et al. |
| 7,722,003 | B2 * | 5/2010 | Ishizaki ............... F16M 11/105 |
| | | | 248/125.1 |
| 7,738,243 | B2 * | 6/2010 | Oshima .................. G06F 1/1601 |
| | | | 361/679.21 |

(Continued)

FOREIGN PATENT DOCUMENTS

| JP | 11-338363 A | 12/1999 |
| KR | 10-2005-0020255 A | 3/2005 |

(Continued)

OTHER PUBLICATIONS

Search Report and Written Opinion dated Jan. 8, 2019, issued by the International Searching Authority in International Application No. PCT/KR2018/010116 (PCT/ISA/210 and PCT/ISA/237).

(Continued)

*Primary Examiner* — Daniel P Wicklund
*Assistant Examiner* — Christopher L Augustin
(74) *Attorney, Agent, or Firm* — Sughrue Mion, PLLC

(57) ABSTRACT

The display apparatus includes a display assembly. The display apparatus further includes a mounting device on which the display assembly is mounted and a rotating shaft forming the center of rotation of the display assembly. The rotating shaft is at a fixed location for the mounting device and the display assembly, respectively. The display assembly is switched between a first mode and a second mode rotated from the first mode about a rotating shaft and is changed in the height of the center of the display assembly.

16 Claims, 13 Drawing Sheets

(56) References Cited

U.S. PATENT DOCUMENTS

| | | | |
|---|---|---|---|
| 9,326,406 B2* | 4/2016 | Brandt | H05K 7/00 |
| 9,528,653 B1 | 12/2016 | Hsu et al. | |
| 2005/0205731 A1* | 9/2005 | Shimizu | F16M 11/105 |
| | | | 248/176.3 |
| 2006/0007644 A1 | 1/2006 | Huilgol et al. | |
| 2006/0011788 A1* | 1/2006 | Jang | F16M 11/28 |
| | | | 248/132 |
| 2007/0047187 A1* | 3/2007 | Kumano | G06F 1/1601 |
| | | | 361/679.06 |
| 2008/0055835 A1 | 3/2008 | Kumano et al. | |
| 2009/0242722 A1* | 10/2009 | Lee | F16M 11/2021 |
| | | | 248/371 |
| 2011/0037739 A1 | 2/2011 | Burge | |
| 2015/0211675 A1* | 7/2015 | Shyu | F16M 11/105 |
| | | | 248/125.7 |
| 2015/0288405 A1 | 10/2015 | Gygax et al. | |
| 2015/0346770 A1 | 12/2015 | Onda | |
| 2016/0007489 A1 | 1/2016 | Huang | |
| 2017/0064852 A1* | 3/2017 | Mercier | G06F 1/16 |
| 2017/0082237 A1* | 3/2017 | Yeh | F16M 11/046 |
| 2017/0219158 A1* | 8/2017 | Chin | F16M 11/22 |
| 2017/0303415 A1* | 10/2017 | Deily | F16M 11/24 |

FOREIGN PATENT DOCUMENTS

| | | |
|---|---|---|
| KR | 10-2008-0104507 A | 12/2008 |
| KR | 10-2010-0125879 A | 12/2010 |

OTHER PUBLICATIONS

Communication dated Jan. 18, 2019, issued by the European Patent Office in counterpart European Application No. 18191508.3.

* cited by examiner

DISPLAY APPARATUS

CROSS-REFERENCE TO RELATED APPLICATION(S)

This application claims is based on and claims priority under 35 U.S.C. § 1119 to Korean Patent Application No. 10-2017-0111498, filed on Aug. 31, 2017, in the Korean Intellectual Property Office, the disclosure of which is incorporated by reference herein in its entirety.

BACKGROUND

1. Field

The disclosure relates to a display apparatus, and more particularly, to a display apparatus having an improved mounting structure.

2. Description of Related Art

In general, a display apparatus displays a screen, and examples of the display apparatus include a monitor and a television. The display apparatus uses a self-emitting display panel such as an Organic Light-Emitting Diode (OLED) or a light-receiving display panel such as a Liquid Crystal Display (LCD) panel.

The display apparatus includes a display assembly for displaying images and a stand for supporting the display assembly. The display assembly is formed in the shape of a plate, and accordingly, a structure such as a stand for making the display assembly stand or supporting it is required.

There are cases in which users of different heights use the display apparatus or in which users use the display apparatus in different usage environments or with different usage purposes. For these cases, a structure for supporting a display assembly at different positions is required.

The above information is presented as background information only to assist with an understanding of the present disclosure. No determination has been made, and no assertion is made, as to whether any of the above might be applicable as prior art with regard to the present disclosure.

SUMMARY

Additional aspects will be set forth in part in the description which follows and, in part, will be apparent from the description, or may be learned by practice of the embodiments.

In accordance with an aspect of the disclosure, provided is a display apparatus capable of improving a mounting structure of a display assembly.

In accordance with another aspect of the disclosure, provided is a display apparatus having a structure capable of stably supporting a display assembly.

In accordance with still another aspect of the disclosure, provided is a display apparatus capable of changing a display mode of a display assembly.

According to an aspect of the disclosure, a display apparatus includes a display assembly, a mounting device on which the display assembly is mounted and a rotating shaft forming a center of rotation of the display assembly. The rotating shaft is disposed at a fixed position on the mounting device and the display assembly. The display assembly is switched between a first mode and a second mode by being rotated with respect to the rotating shaft, and a position of the center of the display assembly changes in a vertical direction based on the display assembly being switched between the first mode and the second mode.

The position of the rotating shaft in the first mode may be identical to the position of the rotating shaft in the second mode.

The rotating shaft may be biased from the center of the display assembly.

The rotating shaft may be spaced at a first distance from a first horizontal reference axis passing the center of the display assembly, and a second distance from a first vertical reference axis passing the center of the display assembly. The first distance and the second distance may be greater than zero.

The first distance may be equal to the second distance.

A first horizontal reference axis are axis passing the center of the display assembly when the display assembly is in the first mode. The rotating shaft is spaced at a distance from a second horizontal reference axis passing the center of the display assembly when the display assembly is in the second mode.

A first vertical reference axis passing the center of the display assembly when the display assembly is in the first mode is identical to a second vertical reference axis passing the center of the display assembly when the display assembly is in the second mode.

The first mode may be a landscape mode in which a horizontal length of the display assembly is longer than a vertical length of the display assembly. The second mode may be a portrait mode in which a vertical length of the display assembly is longer than a horizontal length of the display assembly. The center of the display assembly in the landscape mode may be higher than the center of the display assembly in the portrait mode.

The display apparatus may further include an elastic device configured to generate an elastic force when the display assembly rotates.

When the rotating shaft is biased in one direction from the center of the display assembly, the elastic device may be biased in the other direction with respect to the rotating shaft.

One end of the elastic device may be rotatably fixed on the mounting device, and the other end of the elastic device may be spaced radially from the rotating shaft to be rotatably fixed on the rear surface of the display assembly.

When a position at which the elastic device is compressed to the maximum is referred to as a maximum compression position, the elastic device is positioned at a first elastic position when the display assembly is in the first mode, and at a second elastic position compressed from the first elastic position when the display assembly is in the second mode. The maximum compression position is located between the first elastic position and the second elastic position.

The display apparatus may further include a damper disposed on a path along which the elastic device moves from the maximum compression position to the second elastic position.

The elastic device is at least one of a gas spring, a hydraulic spring, and a coil spring.

In accordance with an aspect of the disclosure, a display apparatus includes a mounting device and a display assembly mounted on the mounting device, and configured to be switched between a first mode and a second mode by being rotated with respect to a rotating shaft. The rotating shaft is biased in a horizontal direction and a vertical direction from a center of the display assembly.

A position of the rotating shaft in the first mode is identical to a position of the rotating shaft in the second mode.

The rotating shaft is spaced at a first distance from a first horizontal reference axis passing the center of the display assembly and at a second distance from a first vertical reference axis passing the center of the display assembly.

The first distance is equal to the second distance.

The display apparatus may further include an elastic device configured to generate an elastic force when the display assembly rotates. One end of the elastic device is rotatably fixed on the mounting device, and the other end of the elastic device is rotatably fixed on a rear surface of the display assembly to be adjacent to the rotating shaft.

In accordance with an aspect of the disclosure, a display apparatus includes a mounting device and a display assembly mounted on the mounting device, and configured to be switched between a first mode and a second mode by being rotated with respect to a rotating shaft. When the display assembly rotates with respect to the rotating shaft, the display assembly is switched between the first mode and the second mode, and a height of a center of the display assembly is adjusted based on the rotating.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
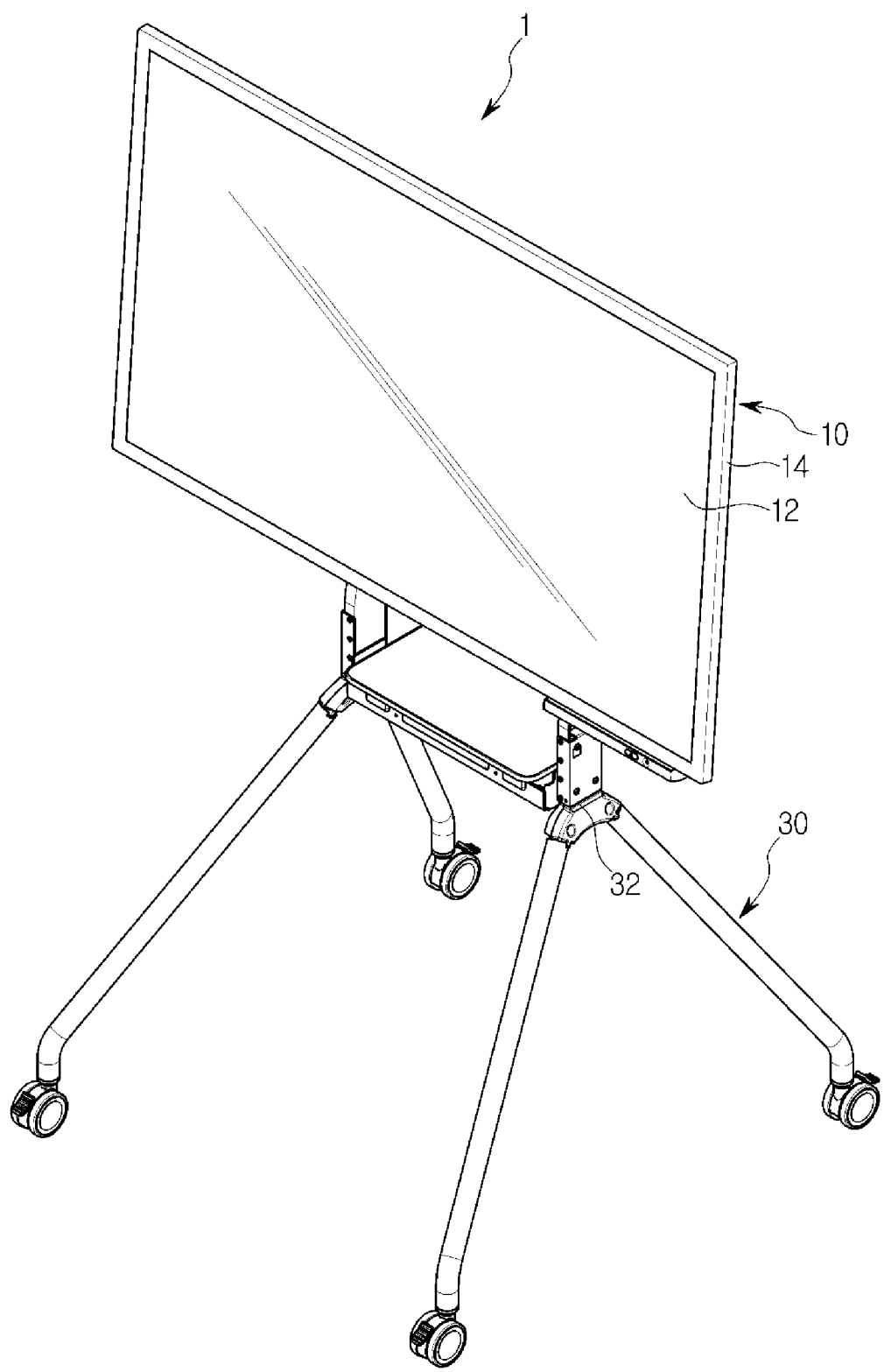
FIG. 1 is a perspective view illustrating a display apparatus according to an embodiment.

Configurations illustrated in the embodiments and the drawings described in the present specification are only the preferred embodiments of the present disclosure, and thus it is to be understood that various modified examples, which may replace the embodiments and the drawings described in the present specification, are possible when filing the present application.

Also, like reference numerals or symbols denoted in the drawings of the present specification represent members or components that perform the substantially same functions.

The terms used in the present specification are used to describe the embodiments of the present disclosure. Accordingly, it should be apparent to those skilled in the art that the following description of exemplary embodiments of the present disclosure is provided for illustration purpose only and not for the purpose of limiting the disclosure as defined by the appended claims and their equivalents. It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present disclosure. As used herein, the term "and/or" includes any and all combinations of one or more of associated listed items.

Hereinafter, embodiments of the present disclosure will be described in detail with reference to the accompanying drawings.

Figure 2:
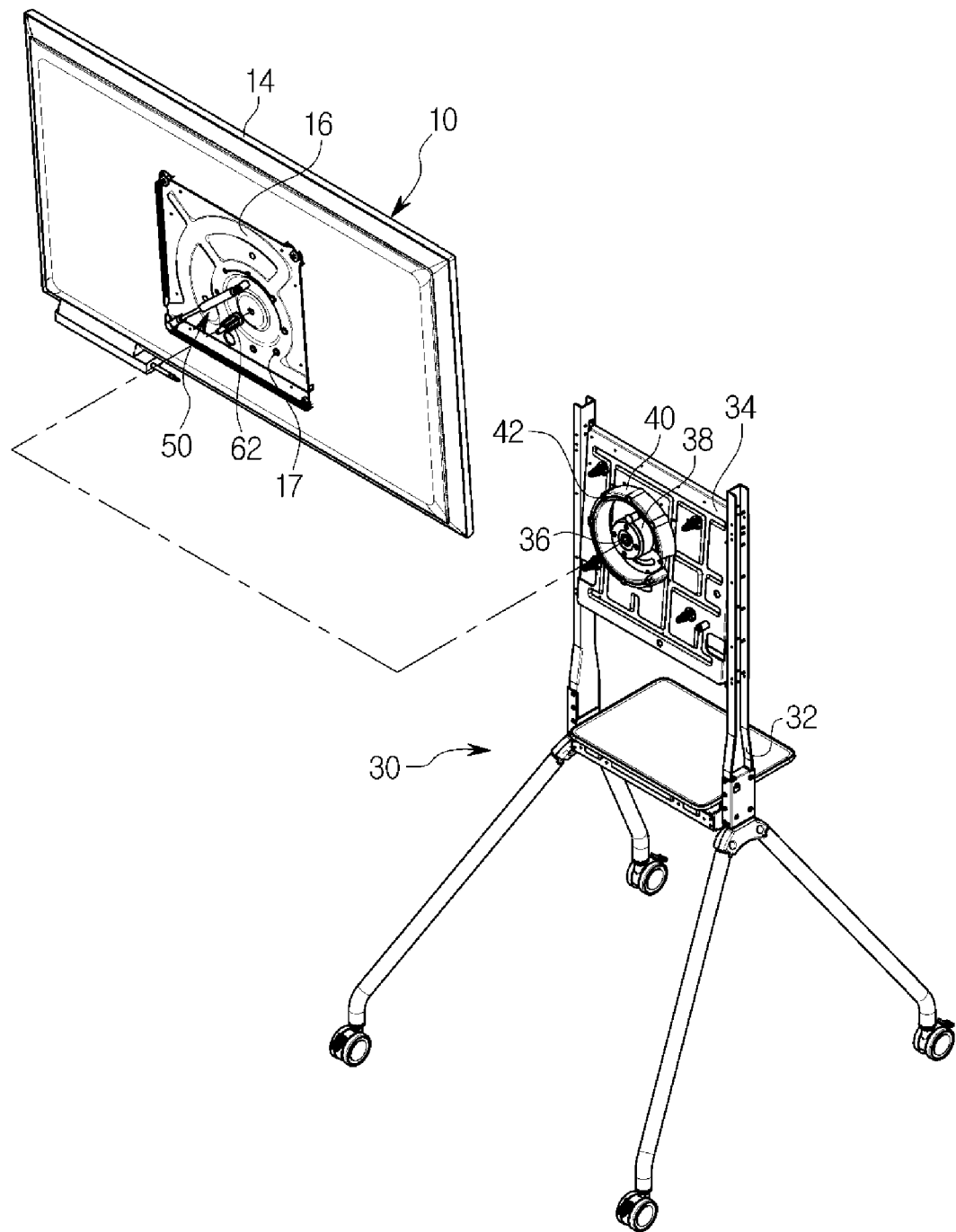
FIG. 2 is an exploded perspective view illustrating a display apparatus according to an embodiment.

FIG. 1 is a perspective view illustrating a display apparatus according to an embodiment of the disclosure. FIG. 2 is an exploded perspective view illustrating a display apparatus according to an embodiment of the disclosure.

The following description will be given under an assumption that the display apparatus is a flat panel display apparatus, however, the display apparatus may be a curved display apparatus having a screen of a fixed curvature, or a bendable or flexible display apparatus capable of changing the curvature of the screen according to a user input, although not limited thereto.

As shown in FIGS. 1 and 2, a display apparatus 1 may include a display assembly 10 for displaying images and a mounting device 30 for supporting the display assembly 10.

The display assembly 10 may include a display panel 12, a backlight unit (not shown) for supplying light to the display panel 12, and a display chassis 14 forming an appearance of the display apparatus 1.

The display assembly 10 may be positioned in a landscape mode LM (see FIG. 4) in which the horizontal length is longer than the vertical length and in a portrait mode PM (see FIG. 8) in which the vertical length is longer than the horizontal length. A user may switch between the landscape mode LM and the portrait mode PM according to his/her usage pattern.

The mounting device 30 may support the display assembly 10. The display assembly 10 may be mounted on the mounting device 30.

The mounting device 30 may include a holder 32 and a support plate 34 (FIG. 2).

The holder 32 may be supported on a mounting surface on which the display apparatus 1 is installed. The holder 32 may be a stand-type holder that stands on a floor or a table, or a ceiling type holder that is fixed on a ceiling. The holder 32 may also be a wall-mounted holder for mounting the display assembly 10 on a wall. Also, the holder 32 may be a movable holder that is movable on the floor. In the embodiment, the holder 32 is assumed to be a movable holder that can move or roll around on the floor. However, the present disclosure is not limited thereto, and the holder 32 may be any one of various types of holders described above.

A support plate 34 (FIG. 2) may be installed on the holder 32. The support plate 34 may be fixed on the holder 32. The support plate 34 may be disposed to be tilted upward at a predetermined angle so that the display assembly 10 can be tilted upward with respect to the front direction.

The mounting device 30 may include a rotating shaft 36.

The rotating shaft 36 may rotate the display assembly 10 between the landscape mode LM and the portrait mode PM. The rotating shaft 36 may form the center of rotation of the display assembly 10.

The rotating shaft 36 may be disposed in the holder 32. More specifically, the rotating shaft 36 may be disposed on the support plate 34. The rotating shaft 36 may be located at a fixed position on the support plate 34. However, when the support plate 34 is omitted, the rotating shaft 36 may be rotatably disposed on the holder 32. In this case, the rotating shaft 36 may also be located at a position fixed on the holder 32.

The mounting device 30 may include a rotating boss 38.

The rotating boss 38 may guide the rotation of the rotating shaft 36. The rotating boss 38 may be mounted on the support plate 34 and disposed around the rotating shaft 36. The rotating boss 38 may include a configuration such as a bearing for rotating the rotating shaft 36. The rotating boss 38 may surround the rotating shaft 36 to prevent the rotating shaft 36 from being dislocated.

The mounting device 30 may include an assembly support 40.

The assembly support 40 may support the rear portion of the display assembly 10 to prevent sagging of the display assembly 10. The assembly support 40 may be spaced a predetermined distance radially from the rotating shaft 36, and formed in an annular shape. The assembly support 40 may protrude annularly from the support plate 34. The rotating shaft 36 and the rotating boss 38 may be disposed inside of the assembly support 40. Therefore, the assembly support 40 can prevent internal components, such as the rotating shaft 36 and the rotating boss 38, from being exposed to the outside. The assembly support 40 may minimize an external influence on the rotating shaft 36 or the rotating boss 38. The assembly support 40 may form an open space 41 (see FIGS. 5 and 7) at one part thereof. An elastic device 50, which will be described later, may pass through the open space 41. One side of the assembly support 40 may be fixed on the support plate 34, and the other side thereof may support a rear surface of the display assembly 10. Thus, the display assembly 10 which is rotatably disposed through the rotating shaft 36 may be prevented from tilting in all directions.

The assembly support 40 may include a resting projection 42. The resting projection 42 may be inserted into and rested in a resting groove 17 formed in the rear surface of the display assembly 10, which will be described later. A plurality of resting projections 42 may be provided on the surface of the assembly support 40 facing the rear surface of the display assembly 10 in such a way as to be spaced apart from each other. That is, a plurality of resting projections 42 may be spaced apart from each other on the front surface of the assembly support 40. The plurality of resting projections 42 may be inserted into a plurality of resting grooves 17 provided in the rear surface of the display assembly 10, which will be described later. The plurality of resting projections 42 may be inserted into the plurality of resting grooves 17 so that the display assembly 10 can be stably positioned in the landscape mode LM or the portrait mode PM. The plurality of resting projections 42 may protrude or be inserted elastically from/into the assembly support 40. With the configuration, according to an embodiment, when the display assembly 10 moves between the landscape mode LM and the portrait mode PM, the plurality of resting projections 42 may be separated from the plurality of resting grooves 17. When mode switching of the display assembly 10 is completed, the plurality of resting projections 42 may be inserted again into the plurality of resting grooves 17 so that the corresponding mode can be stably maintained. The display apparatus may further include a rotating projection 62, described in further detail below, according to an embodiment.

Figure 3:
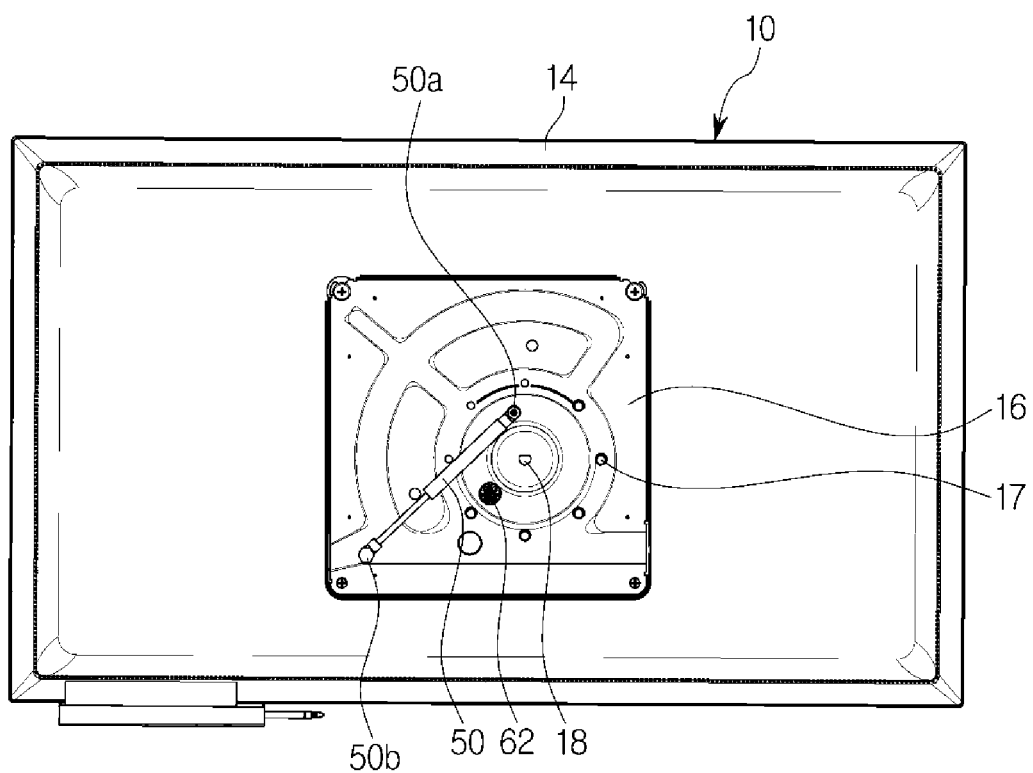
FIG. 3 is a rear view illustrating a display assembly of a display apparatus according to an embodiment.

FIG. 3 is a rear view illustrating a display assembly of a display apparatus according to an embodiment.

The display assembly 10 may rotate on the rotating shaft 36. The display assembly 10 may include a rotation groove 18 into which the rotating shaft 36 is inserted (FIG. 2). In the embodiment, the rotating shaft 36 may be disposed on the mounting device 30 and inserted into the rotation groove 18 of the display assembly 10, although is not limited thereto. As another example, the rotating shaft 36 may be integrated into the display assembly 10. The rotating shaft 36 may have any configuration as long as it can form the center of rotation of the display assembly 10. Also, in the embodiment, the display assembly 10 may include a mounting plate 16 on the rear surface thereof, and the rotation groove 18 may be formed in the mounting plate 16. However, the present disclosure is not limited to this, and the rotation groove 18 may be formed in the rear surface of the display assembly 10.

Considering the level of the user's eye, the height of the display assembly 10 when it is in the landscape mode LM may be different from the height of the display assembly 10 when it is in the portrait mode PM. If the rotating shaft 36 is disposed in the display assembly 10 such that the center of the display assembly 10 in the landscape mode LM is identical to the center of the display assembly 10 in the portrait mode PM, it may be difficult to adjust the height of the display assembly 10 according to mode switching. Also, even if the display apparatus 1 has a height adjusting device, the separate configuration for height adjustment and an operation for operating the configuration for height adjustment are needed, which causes inconvenience. However, according to an embodiment, by changing the position of the rotating shaft 36, a rotation and height adjustments of the display assembly 10 may be performed at the same time. That is, the rotation and height adjustments of the display assembly 10 may be performed together with the same operation or operations.

Figure 4:
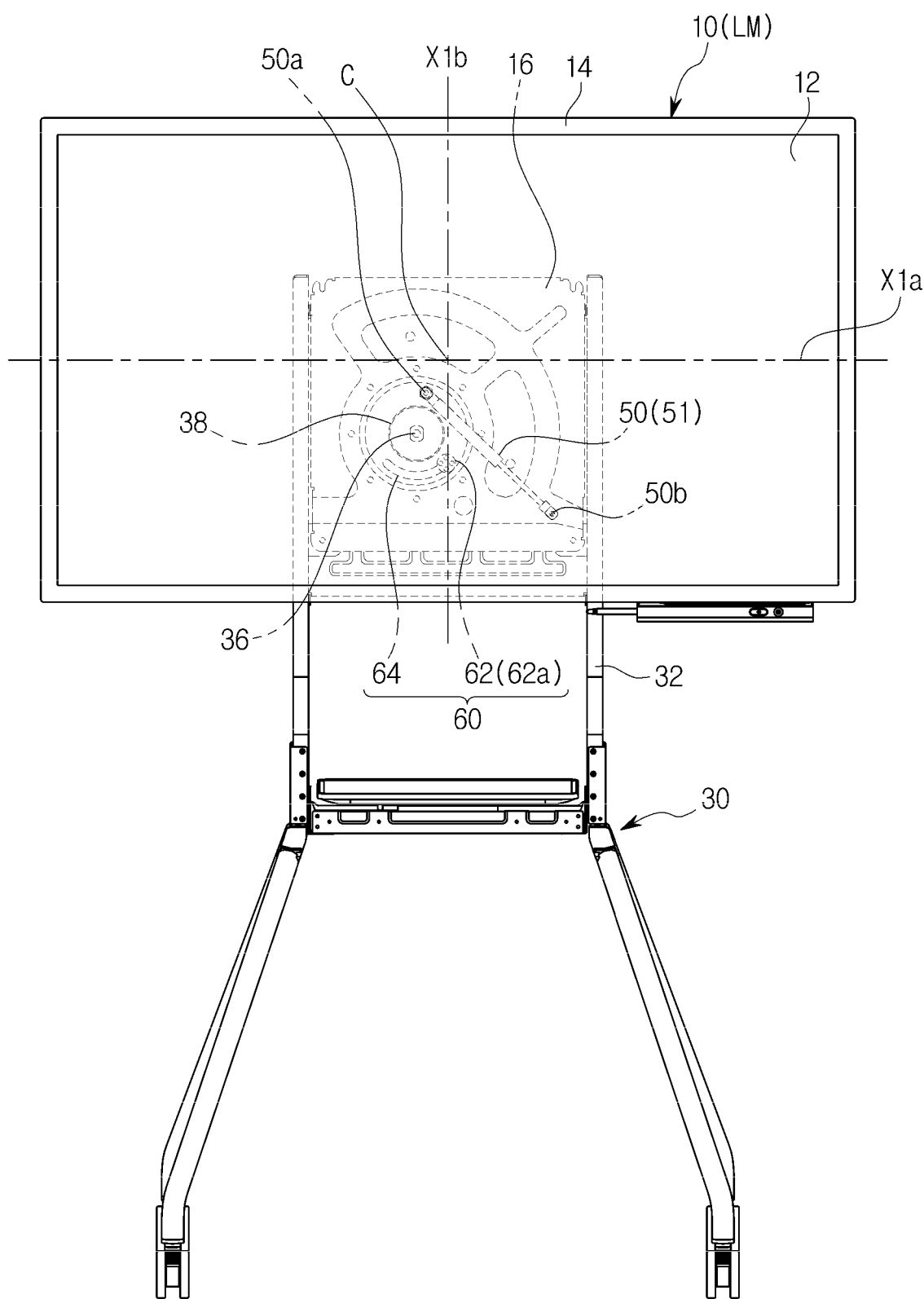
FIG. 4 is a view illustrating a display apparatus when a display assembly is in a landscape mode according to an embodiment.
Figure 8:
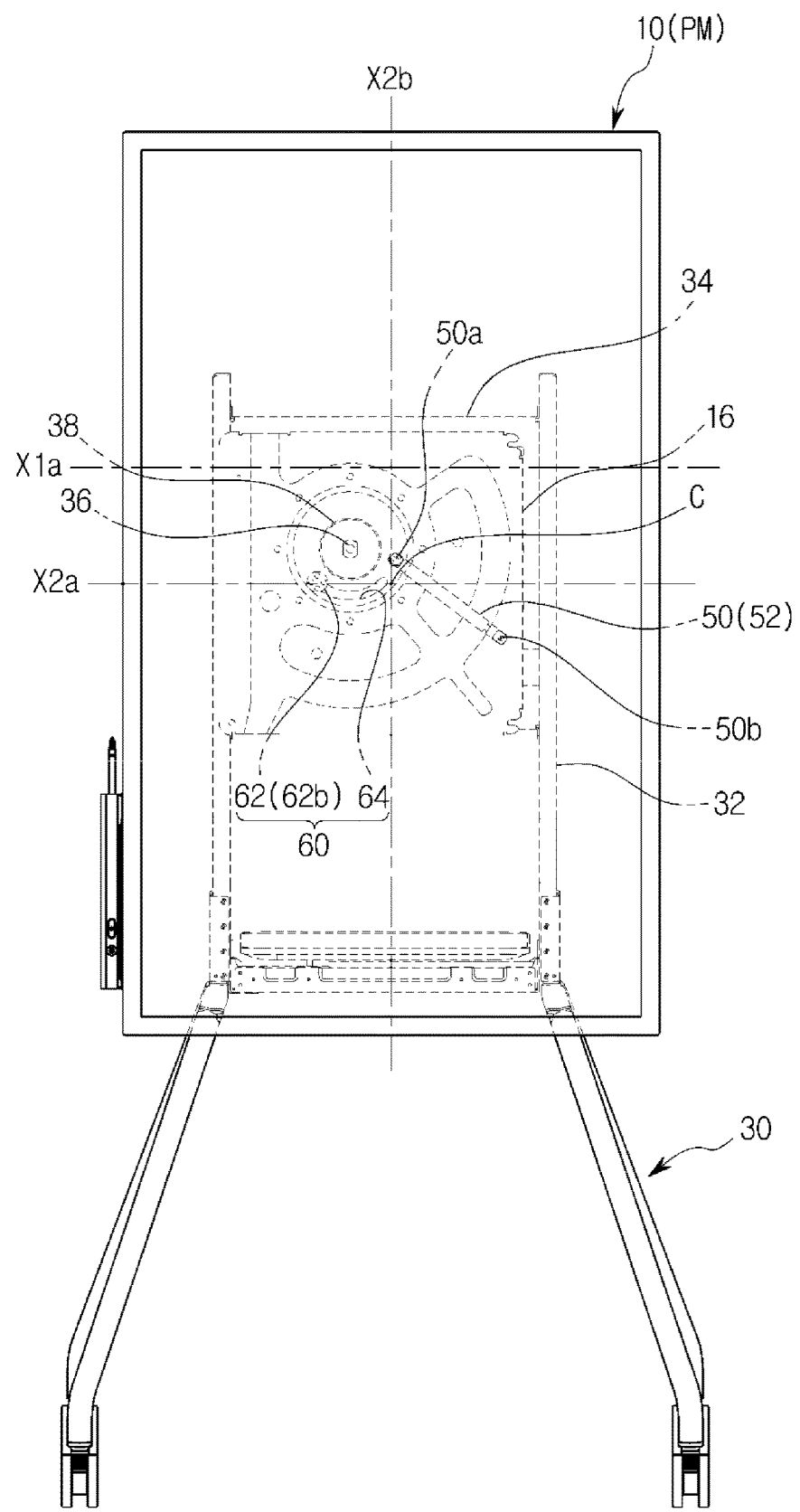
FIG. 8 is a view illustrating a display apparatus when a display assembly is in a portrait mode according to an embodiment.

The rotating shaft 36 may be biased from the center of the display assembly 10. That is, the rotating shaft 36 may be eccentrically disposed in the display assembly 10. A horizontal reference axis passing through the center of the display assembly 10 when the display assembly 10 is in the landscape mode LM is referred to as a first horizontal reference axis X1a (FIG. 4), and a vertical reference axis passing through the center of the display assembly 10 when the display assembly 10 is in the landscape mode LM is referred to as a first vertical reference axis X1$b$ (FIG. 4). A horizontal reference axis passing through the center of the display assembly 10 when the display assembly 10 is in the portrait mode PM is referred to as a second horizontal reference axis X2$a$ (FIG. 8), and a vertical reference axis passing through the center of the display assembly 10 when the display assembly 10 is in the portrait mode PM is referred to as a second vertical reference axis X2$b$ (FIG. 8).

Figure 5:
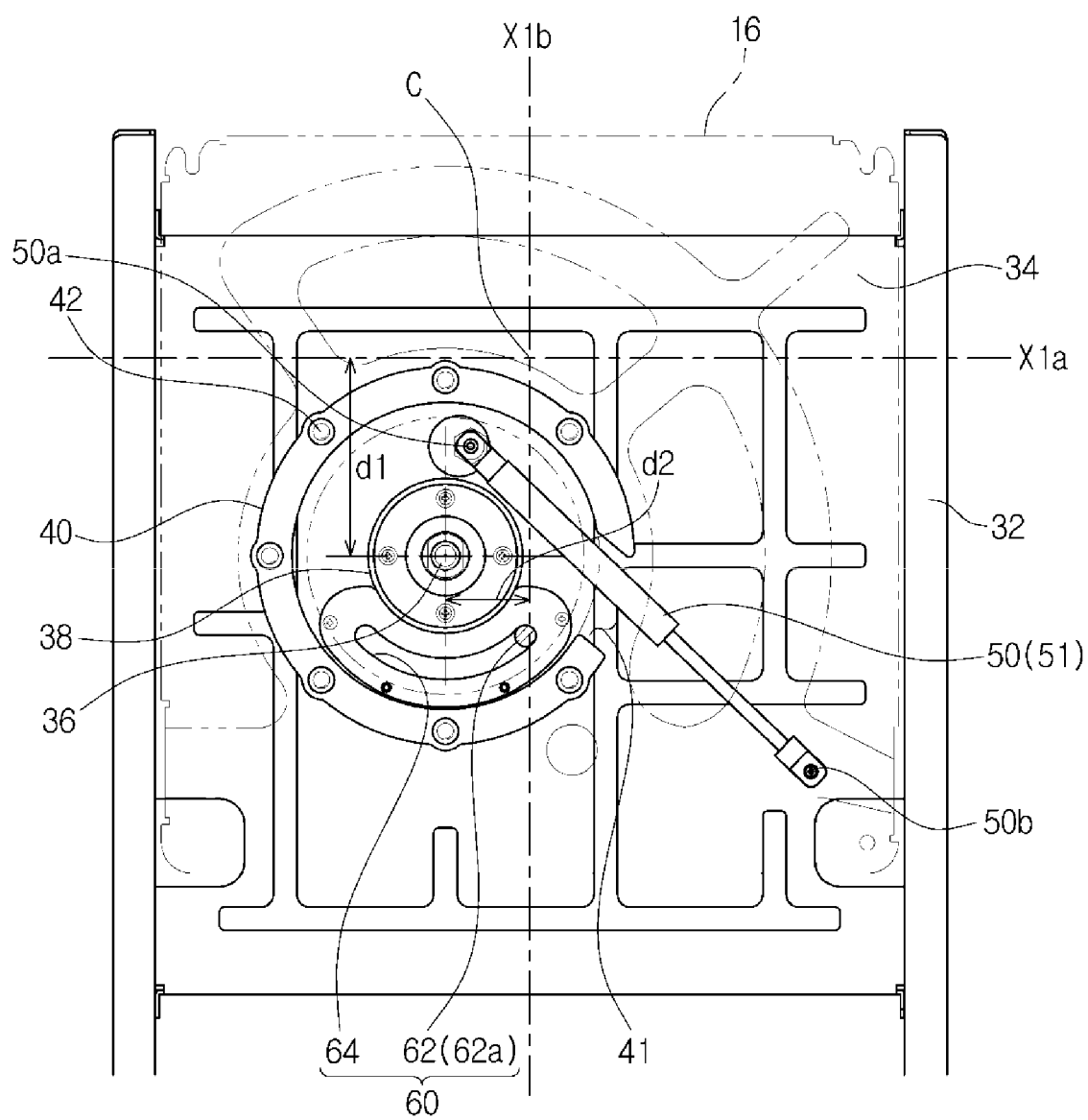
FIG. 5 is a view illustrating a configuration for supporting a display assembly in a display apparatus when the display assembly is in a landscape mode according to an embodiment.

FIG. 4 is a view illustrating a display apparatus when a display assembly is in a landscape mode, according to an embodiment. FIG. 5 is a view illustrating a configuration for supporting a display assembly in a display apparatus when the display assembly is in a landscape mode, according to an embodiment.

As shown in FIG. 4, when the display assembly 10 is in the landscape mode LM, the rotating shaft 36 may be biased from the center of the display assembly 10. In detail, the rotating shaft 36 may be spaced a first distance d1 (FIG. 5) apart from the first horizontal reference axis X1$a$ and a second distance d2 (FIG. 5) apart from the first vertical reference axis X1$b$. According to an embodiment, the first and second distances d1 and d2 are greater than zero. Also, when the display assembly 10 is in the landscape mode LM, the rotating shaft 36 may be disposed downward in the direction of gravity from the center of the display assembly 10. That is, the rotating shaft may be positioned below the center of the display assembly 10. With the configuration according to an embodiment, when the display assembly 10 rotates from the landscape mode LM to the portrait mode PM, the display assembly 10 may move such that the center in the portrait mode PM is lower than the center in the landscape mode LM (FIG. 8). That is, by rotating the display assembly 10, the mode of the display assembly 10 may change, and simultaneously, the height of the display assembly 10 may also be adjusted.

The rotating shaft 36 may be disposed at a fixed position relative to the display assembly 10 and the mounting device 30. That is, the rotating shaft 36 may be located at the same position even when the mode of the display assembly 10 changes. By rotating the display assembly 10 on the rotating shaft 36 without moving the rotating shaft 36, the mode of the display assembly 10 may change, and the height of the display assembly 10 may be adjusted. Thereby, it may be possible to stably support the display assembly 10, while changing the mode of the display assembly 10.

The display apparatus 1 may include the elastic device 50.

The elastic device 50 may cause the display assembly 10 to rotate stably. One end 50$b$ of the elastic device 50 may be fixed at the support plate 34 of the mounting device 30, and the other end 50$a$ of the elastic device 50 may be fixed at the rear surface of the display assembly 10. Both ends 50$b$ and 50$a$ of the elastic device 50 may be rotatably fixed. The other end 50$a$ of the elastic device 50 may be rotatably fixed at the rear surface of the display assembly 10 to be adjacent to the rotating shaft 36. The length of the elastic device 50 may vary. The elastic device 50 may be a gas spring, a hydraulic spring, a coil spring, or the like. That is, the elastic device 50 may be any configuration as long as it can stably support the display assembly 10.

The elastic device 50 may apply a force in a direction that is opposite to the rotation direction of the display assembly 10. When the rotating shaft 36 is shifted to the left from the center of the display assembly 10 (disposed on the left from the center of the display assembly 10), one end of the elastic device 50 may be shifted rightward from the rotating shaft 36 (disposed on the right from the rotating shaft 36). On the other hand, when the rotating shaft 36 is disposed on the right of the center of the display assembly 10, one end of the elastic device 50 may be disposed on the left from the rotating shaft 36. In the embodiment, when the display apparatus 1 is seen from the front, the rotating shaft 36 may be disposed to the left from the center of the display assembly 10. Therefore, one end 50$b$ of the elastic device 50 may be disposed on the right of the rotating shaft 36.

The other end 50$a$ of the elastic device 50 may be disposed adjacent to the rotating shaft 36. In the embodiment, the other end 50$a$ of the elastic device 50 may be disposed above the rotating shaft 36.

The elastic device 50 may have a maximum compressive force when both ends 50$b$ and 50$a$ of the elastic device 50 and the rotating shaft 36 are located on the same line. At this time, the position of the elastic device 50 may be referred to as a maximum compression position. That is, a position at which the elastic device 50 passes an XM axis (see FIG. 9) may be referred to as a maximum compression position. Since a rotation angle between the landscape mode LM and the portrait mode PM of the display assembly 10 is 90 degrees, the other end 50$a$ of the elastic device 50 may also rotate 90 degrees with respect to the rotating shaft 36. When the display assembly 10 is in the landscape mode LM, the elastic device 50 may be at a first compression position 51, and when the display assembly 10 is in the portrait mode PM, the elastic device 50 may be at a second compression position 52 (FIG. 8). In view of this, the elastic device 50 may be configured such that a range in which the first and second compression positions 51 and 52 are formed does not exceed the maximum compression position. Thereby, the elastic device 50 may stably support the weight of the display assembly 10 when the display assembly 10 moves from the landscape mode LM to the portrait mode PM. Meanwhile, the elastic device 50 may cause the display assembly 10 to easily move elastically when the display assembly 10 moves from the portrait mode PM to the landscape mode LM.

The display apparatus 1 may include a stopper 60.

The stopper 60 may limit a rotation of the display assembly 10 to a predetermine angle when the display assembly 10 moves from the landscape mode LM to the portrait mode PM or from the portrait mode PM to the landscape mode LM. In the embodiment, the stopper 60 may limit a rotation of the display assembly 10 to 90 degrees.

The stopper 60 may include a rotating projection 62 and a rotation guide 64.

A rotating projection 62 may be fixed at the rear surface of the display assembly 10 and rotate together with the display assembly 10 when the display assembly 10 rotates.

A rotation guide 64 may be disposed on the mounting device 30, and the rotating projection 62 may be inserted into the rotation guide 64. When the display assembly 10 rotates, the rotating projection 62 may move along the rotation guide 64. For this purpose, the rotation guide 64 may be spaced radially from the rotating shaft 36. In the embodiment, the rotation guide 64 may be positioned between the rotating boss 38 and the assembly support 40 (FIG. 5).

The rotation guide 64 may be formed in the shape of an arc around the rotating shaft 36. The rotation guide 64 may be formed in the shape of an arc having an angle of 90 degrees with the rotating shaft 36 as the center.

When the display assembly 10 is in the landscape mode LM, the rotating projection 62 may be located at a first limiting position 62$a$, which is one end of the rotation guide 64. Also, when the display assembly 10 is in the portrait mode PM, the rotating projection 62 may be located at a second limiting position 62b (FIG. 8) which is the other end of the rotation guide 64.

When the mode of the display assembly 10 changes, the rotating projection 62 may move between the first and second limiting positions 62a and 62b so that the display assembly 10 can rotate with a certain angle range.

Hereinafter, embodiment of the operation of the display apparatus 1 according to the above-described configuration will be described in further detail.

Figure 6:
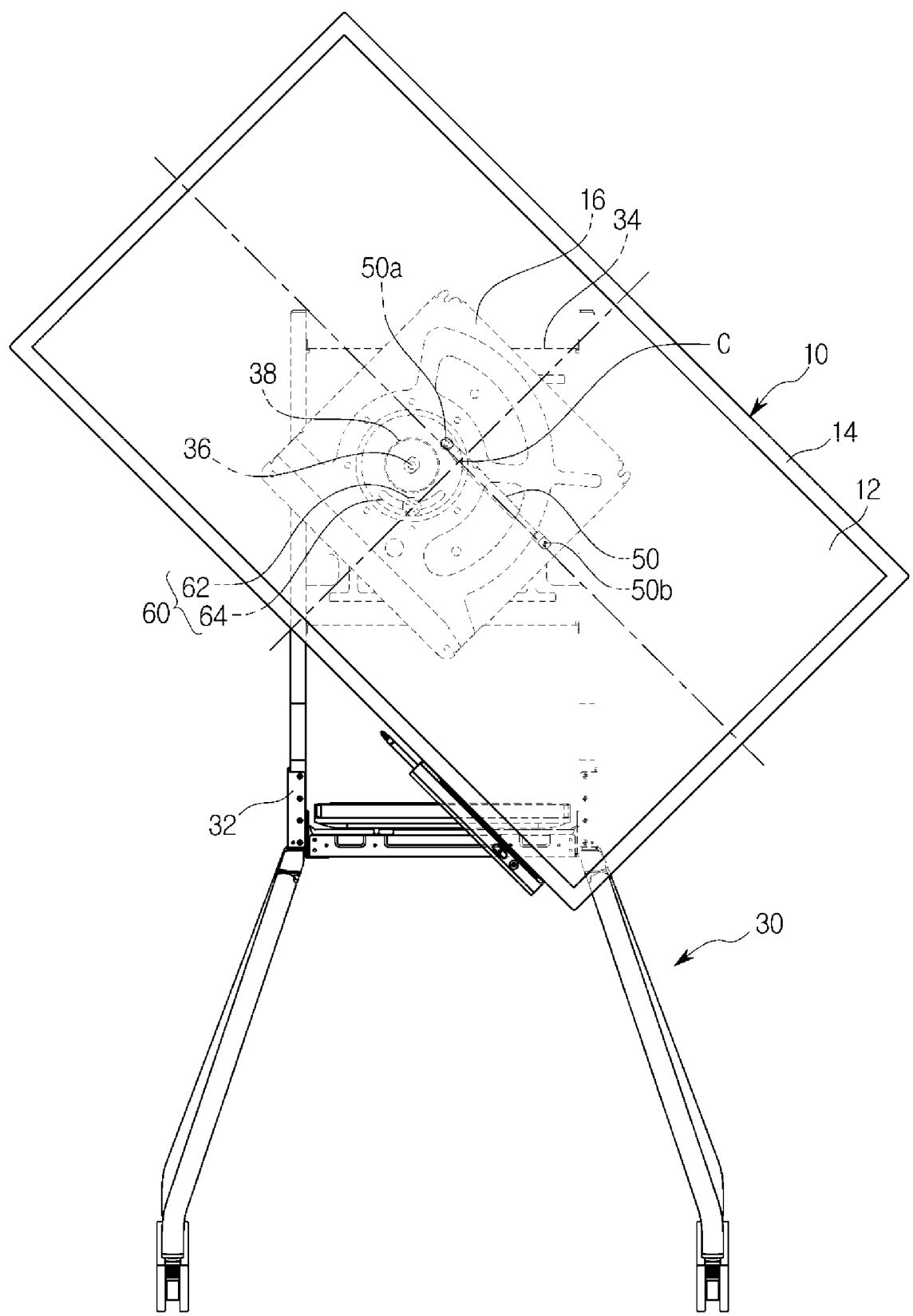
FIG. 6 is a view illustrating a display apparatus when a display assembly rotates according to an embodiment.
Figure 7:
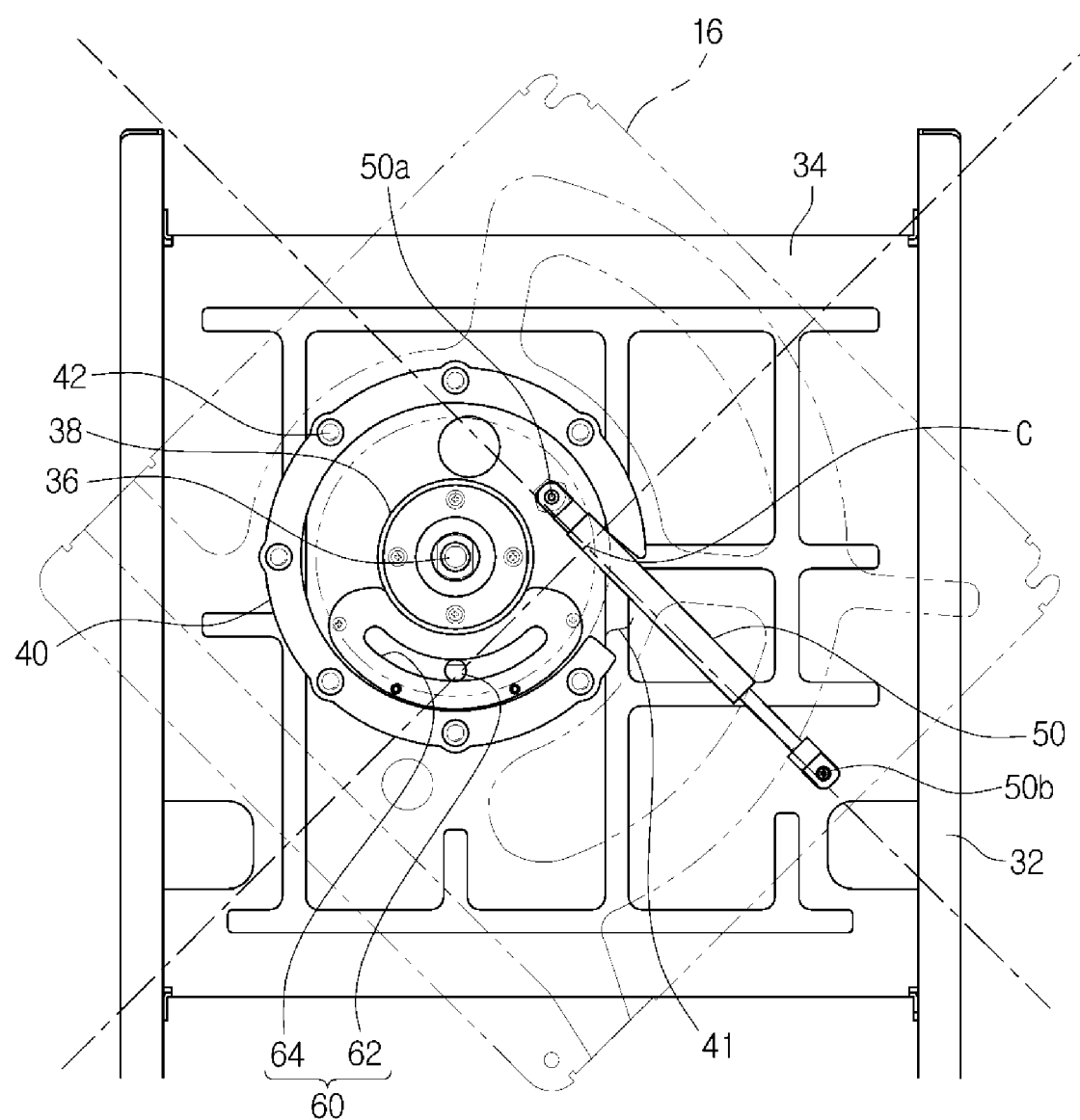
FIG. 7 is a view illustrating a structure for supporting a display assembly in a display apparatus when the display assembly rotates according to an embodiment.
Figure 9:
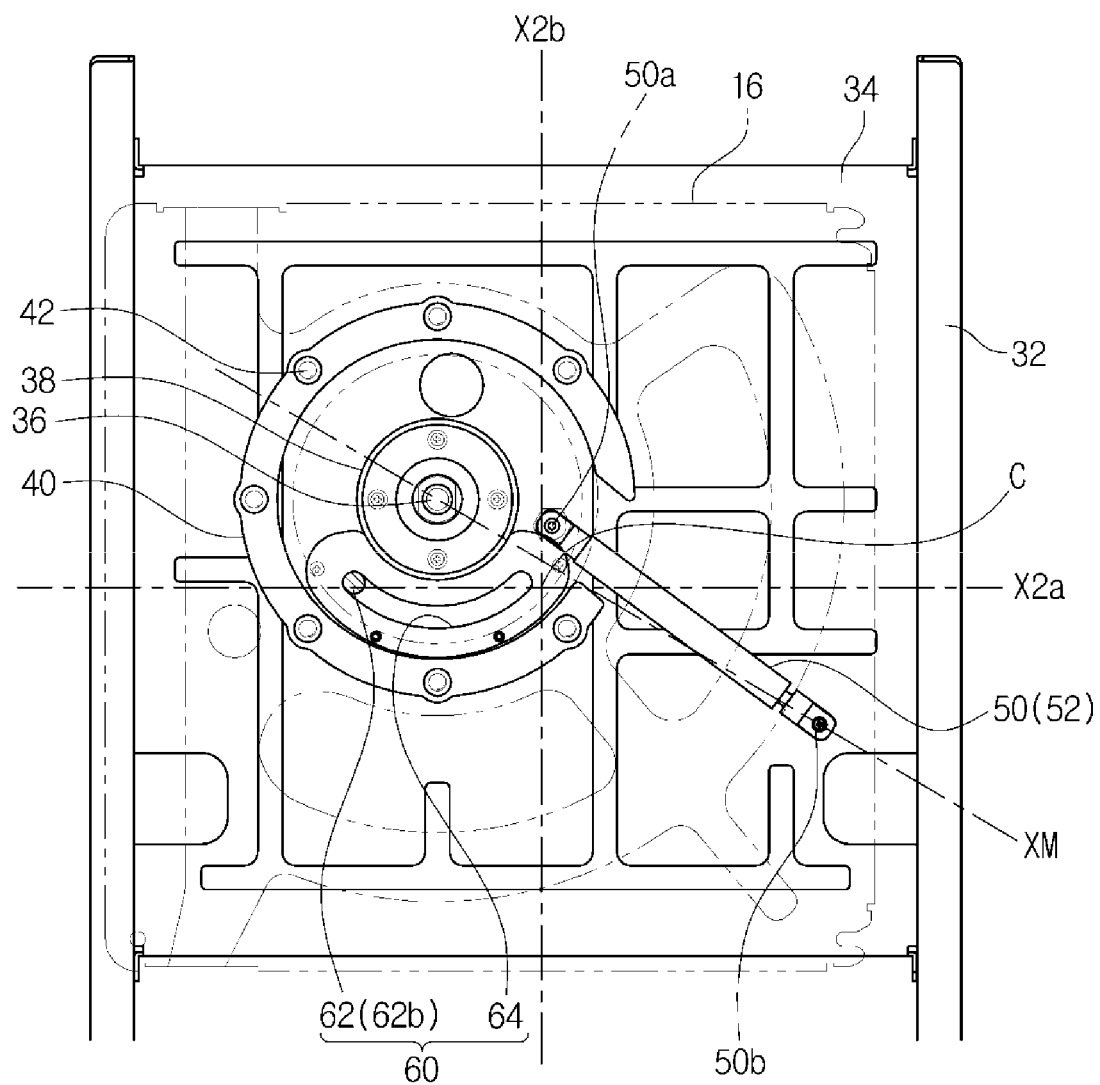
FIG. 9 is a view illustrating a configuration of supporting a display assembly in a display apparatus when the display assembly is in a portrait mode according to an embodiment.

FIG. 6 is a view illustrating a display apparatus when a display assembly rotates according to an embodiment. FIG. 7 is a view illustrating a structure for supporting a display assembly in a display apparatus when the display assembly rotates according to an embodiment. FIG. 8 is a view illustrating a display apparatus when a display assembly is in a portrait mode according to an embodiment. FIG. 9 is a view illustrating a configuration of supporting a display assembly in a display apparatus when the display assembly is in a portrait mode according to an embodiment. The following description will be given with reference to FIGS. 4 and 5.

FIGS. 4 and 5 are views illustrating the display assembly 10 in the landscape mode LM according to an embodiment. The elastic device 50 may be located at the first compression position 51 (FIG. 5). The rotating shaft 36 may be biased from the center of the display assembly 10. That is, the center of the rotating shaft 36 may be lower than the first horizontal reference axis X1a and located to the left of the first vertical reference axis X1b.

FIGS. 6 and 7 are views illustrating a state of the display assembly 10 when the display assembly 10 shown in FIGS. 4 and 5 rotates to a predetermined angle according to an embodiment. In this case, the elastic device 50 may be positioned between the first compression position 62a and the second compression position 62b so that the compression force increases. It may be possible to stably support the weight of the display assembly 10 through the compressive force of the elastic device 50.

FIGS. 8 and 9 are views illustrating a state of the display assembly 10 when the display assembly 10 shown in FIGS. 6 and 7 further rotates until it is set to the portrait mode PM according to an embodiment. At this time, the elastic device 50 may be located at the second compression position 52 so that the compression force further increases than in the case of FIGS. 6 and 7. Therefore, it may be possible to stably support the weight of the display assembly 10 through the compressive force of the elastic device 50.

In the portrait mode PM of the display assembly 10, the second horizontal reference axis X2a may be lower than the first horizontal reference axis X1a (see FIG. 8). That is, when the display assembly 10 rotates to change the mode, the height of the display assembly 10 may be adjusted accordingly without a user having to adjust the height of the display assembly 10.

The embodiment relates to an example, in which the display assembly 10 is switched from the landscape mode LM to the portrait mode PM, however, the embodiment may also be applied to a case in which the display assembly 10 is switched from the portrait mode PM to the landscape mode LM. Also, the embodiment relates to an example in which the center of the display assembly 10 is lowered when the display assembly 10 is switched from the landscape mode LM to the portrait mode PM. However, the present disclosure is not limited to this, and may be configured to allow a user to set a position of the rotating shaft 36 as necessary so that the center of the display assembly 10 rises when the display assembly 10 is switched from the landscape mode LM to the portrait mode PM.

Hereinafter, a display apparatus according to another embodiment will be described.

Hereinafter, descriptions about the same components as those described above will be omitted.

Figure 10:
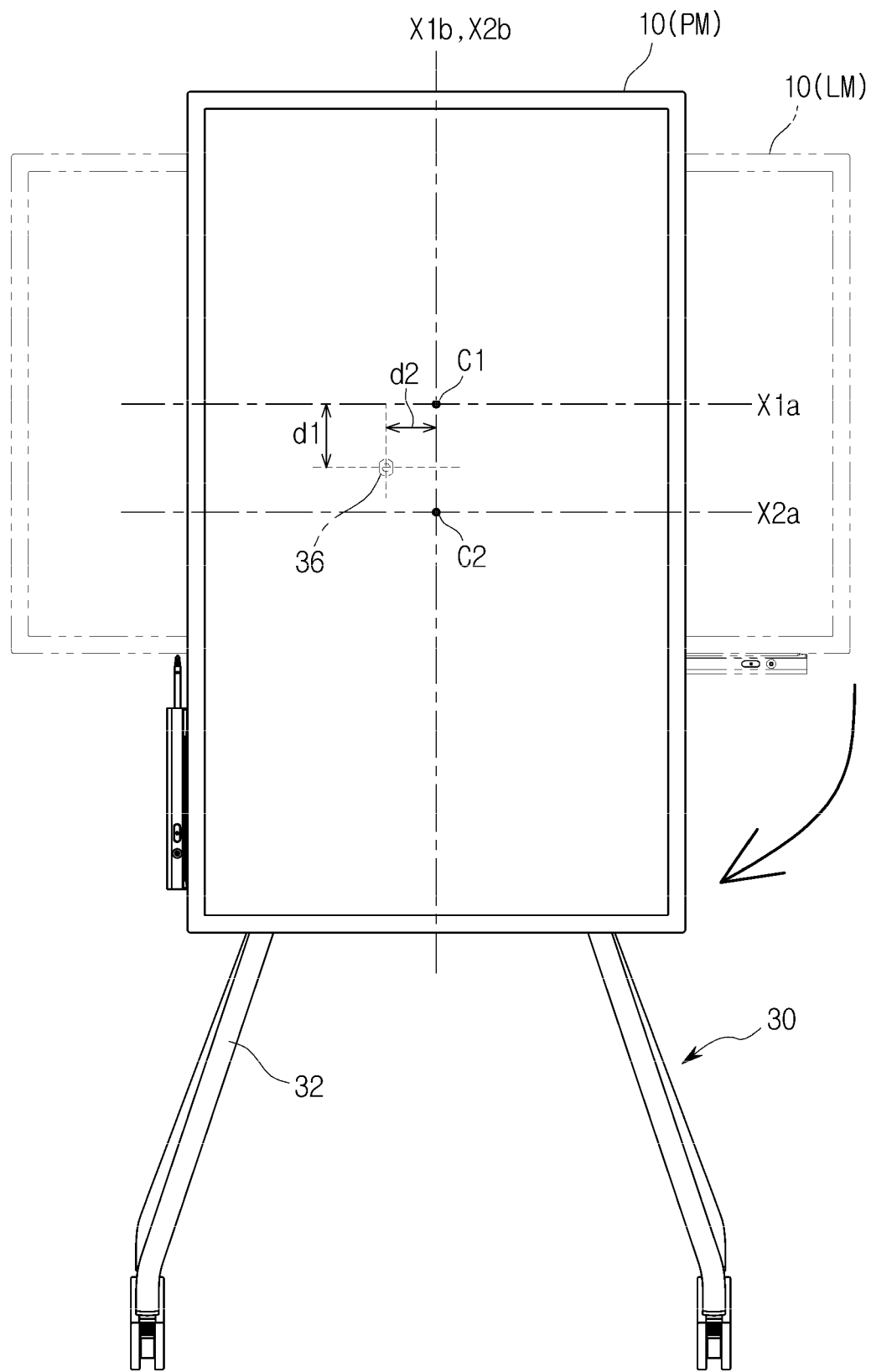
FIG. 10 is a view illustrating a relationship between mode switching of a display assembly and a position of a rotating shaft in a display apparatus according to another embodiment.

FIG. 10 is a view illustrating the relationship between mode switching of a display assembly and a position of a rotating shaft in a display apparatus according to another embodiment.

The rotating shaft 36 may be biased from the center of the display assembly 10. That is, the rotating shaft 36 may be eccentrically disposed in the display assembly 10. A horizontal reference axis passing through the center of the display assembly 10 when the display assembly 10 is in the landscape mode LM is referred to as a first horizontal reference axis X1a, and a vertical reference axis passing through the center of the display assembly 10 when the display assembly 10 is in the landscape mode LM is referred to as a first vertical reference axis X1b. A horizontal reference axis passing through the center of the display assembly 10 when the display assembly 10 is in the portrait mode PM is referred to as a second horizontal reference axis X2a, and a vertical reference axis passing through the center of the display assembly 10 when the display assembly 10 is in the portrait mode PM is referred to as a second vertical reference axis X2b.

The display assembly 10 may be positioned such that the first vertical reference axis X1b is identical to the second vertical reference axis X2b. That is, even when the display assembly 10 is switched between the landscape mode LM and the portrait mode PM, the center of the display assembly 10 may move in an up-down direction without moving in a left-right direction. Therefore, the display assembly 10 may be stably supported by the mounting device 30 since the center of the display assembly 10 does not move in the left-right direction upon mode switching.

The rotating shaft 36 may be positioned such that a first distance d2 by which the rotating shaft 36 is spaced from the first vertical reference axis X1b is equal to a second distance d1 by which the rotating shaft 36 is spaced from the first horizontal reference axis X1a. Likewise, the rotating shaft 36 may be positioned such that a distance by which the rotating shaft 36 is spaced from the second vertical reference axis X2b is equal to a distance by which the rotating shaft 36 is spaced from the second horizontal reference axis X2a.

With the configuration, the center of the display assembly 10 in the horizontal direction may not change even when the display assembly 10 rotates on the rotating shaft 36 as the center for mode switching.

Hereinafter, a display apparatus according to another embodiment will be described.

Hereinafter, descriptions about the same components as those described above will be omitted.

Figure 11:
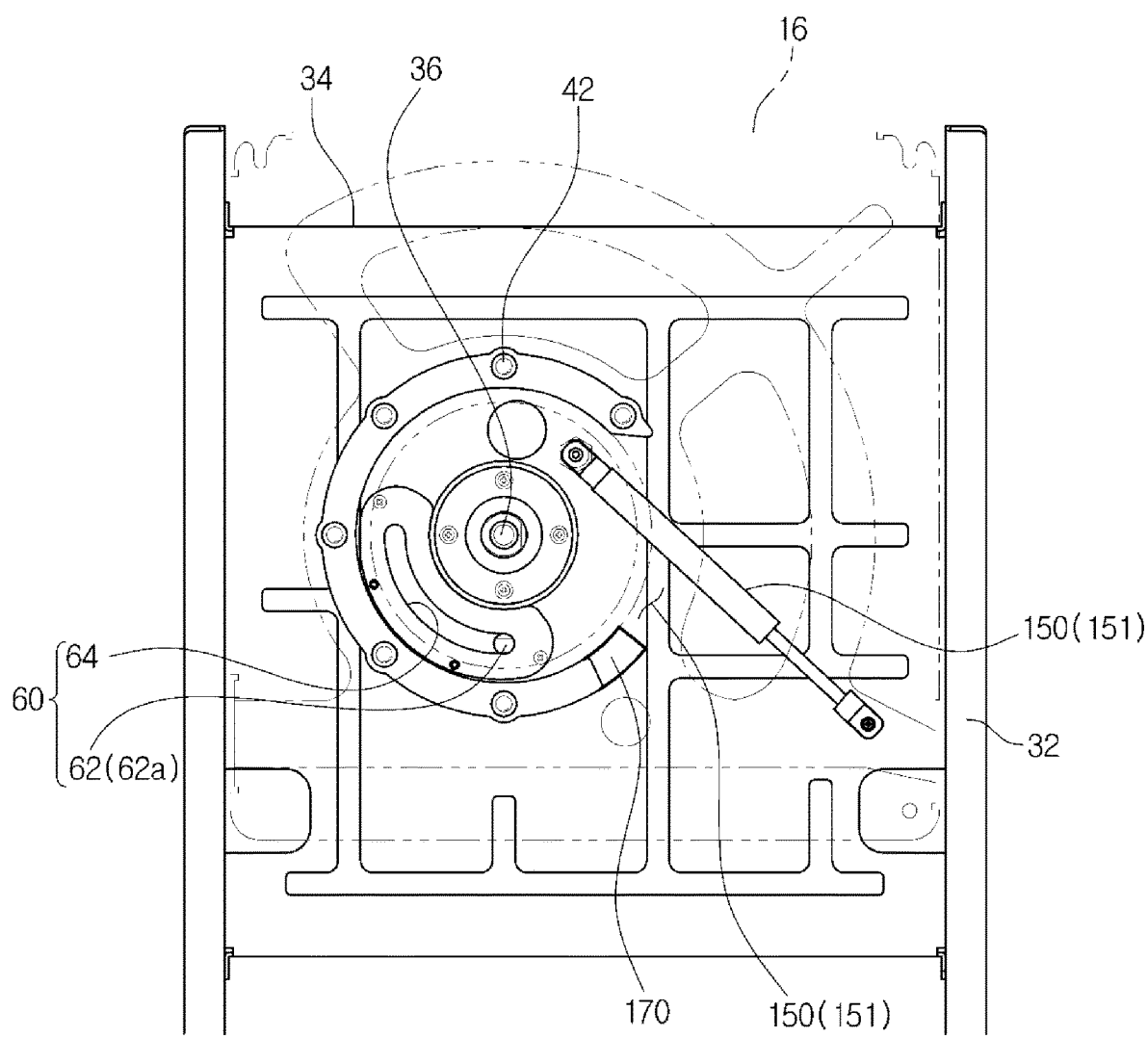
FIGS. 11, 12, and 13 are views illustrating a configuration of supporting a display assembly when a mode of the display assembly is switched in a display apparatus according to another embodiment.
Figure 12:
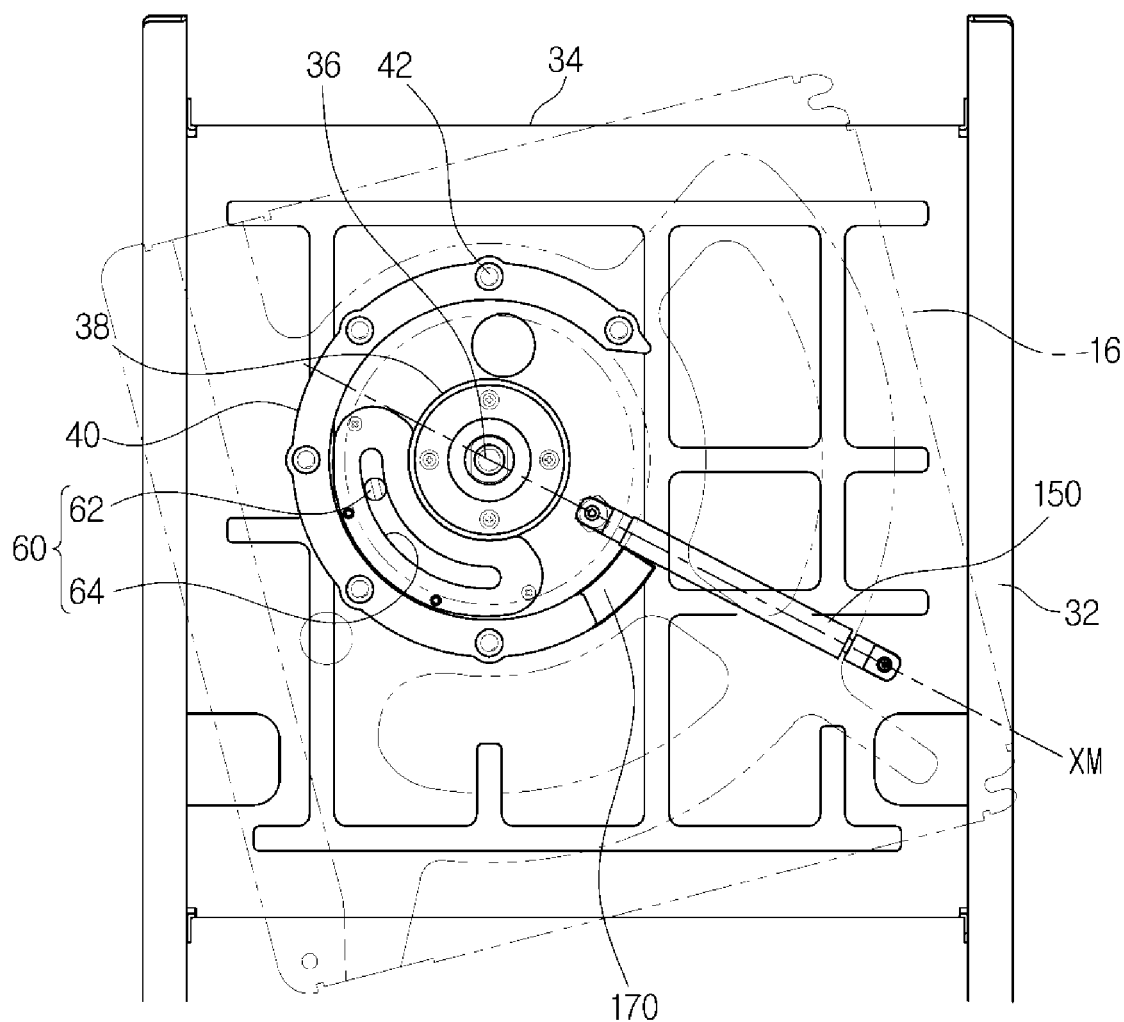
Figure 13:
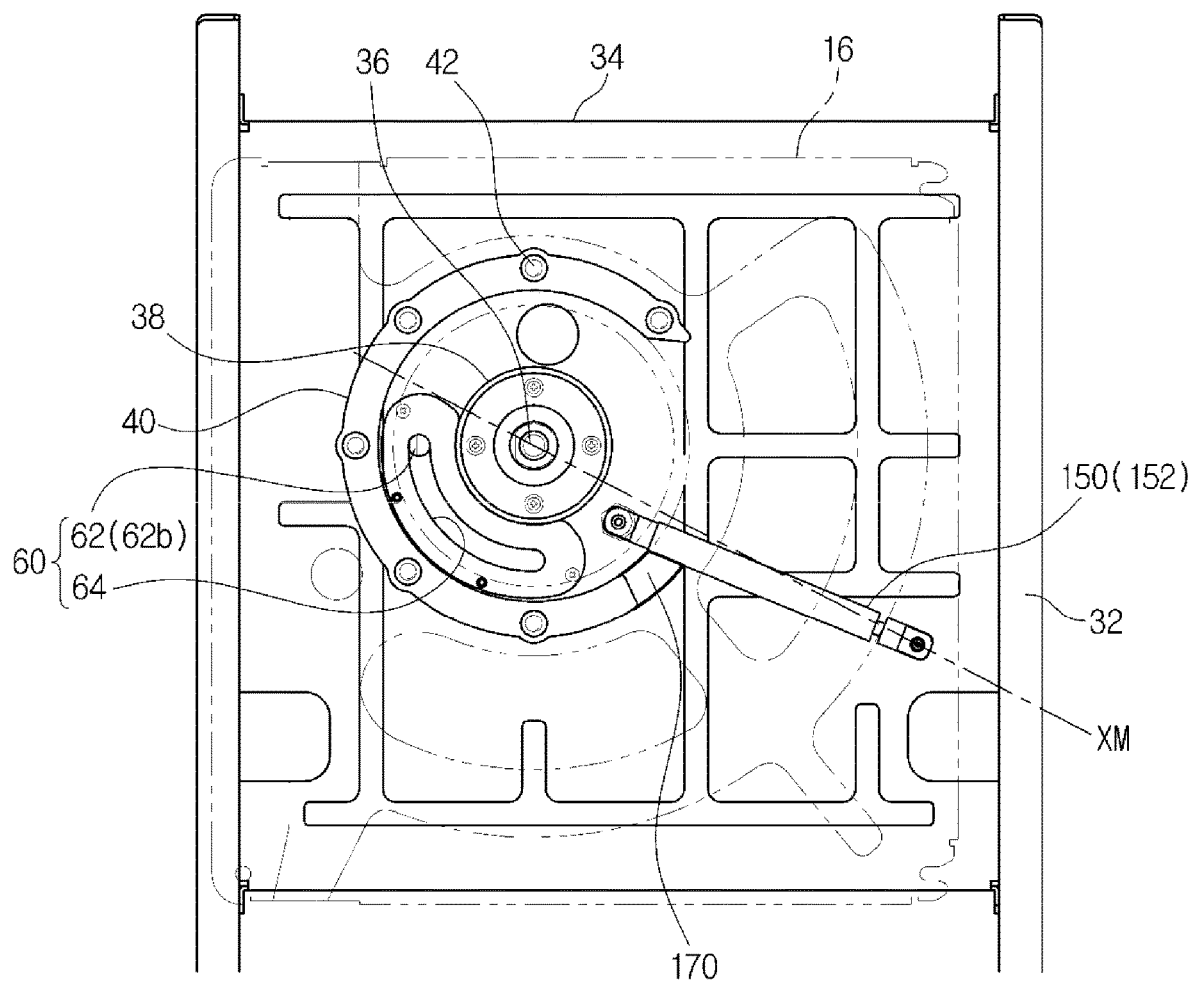

FIGS. 11, 12, and 13 are views illustrating a configuration for supporting a display assembly when a mode of the display assembly is switched in a display apparatus according to another embodiment.

The display apparatus 1 may include an elastic device 150.

The elastic device 150 may enable the display assembly 10 to stably rotate. One end of the elastic device 150 may be fixed on the support plate 34 of the mounting device 30, and the other end thereof may be fixed on the rear surface of the display assembly 10. Both ends of the elastic device 150 may be rotatably fixed. The other end of the elastic device 150 may be rotatably fixed on the rear surface of the display assembly 10 adjacent to the rotating shaft 36. The length of the elastic device 150 may change.

When both ends of the elastic device 150 and the rotating shaft 36 are located on the same line, the elastic device 150 may have a maximum compressive force. At this time, the position of the elastic device 150 may be referred to as a maximum compression position. That is, a position in which the elastic device 150 passes an XM axis (see FIG. 12) is referred to as a maximum compression position. Since a rotation angle between the landscape mode LM and the portrait mode PM of the display assembly 10 is 90 degrees, the other end of the elastic device 50 may also rotate 90 degrees with respect to the rotating shaft 36. The elastic device 150 may be at a first compression position 151 (FIG. 11) when the display assembly 10 is in the landscape mode LM, and also when the display assembly 10 is in the portrait mode PM, the elastic device 150 may be at a second compression position 152 (FIG. 13). The elastic device 150 may be configured such that a range in which the first and second compression positions are formed passes through the maximum compression position.

That is, when the mode of the display assembly 10 changes, the elastic device 150 may pass through the maximum compression position.

FIG. 11 is a view illustrating the elastic device 150 positioned at the first compression position 151 when the display assembly 10 is in the landscape mode LM, as shown in FIG. 4.

FIG. 12 is a view illustrating the elastic device 150 positioned at the maximum compression position when the mode of the display assembly 10 changes, as shown in FIG. 6.

FIG. 13 is a view illustrating the elastic device 150 positioned at the second compression position 152 when the display assembly 10 is in the portrait mode PM, as shown in FIG. 8.

When the elastic device 150 moves from the maximum compression position to the second compression position 152, the elastic device 150 may generate an elastic force to cause the display assembly 10 to be stably positioned in the portrait mode PM.

In addition, when the elastic device 150 moves from the maximum compression position to the first compression position 151, the elastic device 150 may generate an elastic force to cause the display assembly 10 to be stably positioned in the landscape mode LM.

That is, since the maximum compression position is located between the first compression position 151 and the second compression positions 152, mode switching of the display assembly 10 will not occur without an external force that is equal to or greater than a predetermined magnitude so that the display assembly 10 can be stably positioned.

The display apparatus 1 may include a damper 170. The damper 170 may be disposed on the movement path of the elastic device 150. The damper 170 may prevent the elastic device 150 from being damaged due to acceleration when the elastic device 150 moves according to a rotation of the display assembly 10.

In the embodiment, the damper 170 may be disposed on the movement path of the elastic device 150 along which the elastic device 150 moves from the maximum compression position to the second compression position 152. As the elastic device 150 moves from the maximum compression position to the second compression position 152, the elastic device 150 may collide with another component or get a shock due to the elastic force of the elastic device 150 and acceleration caused by the weight of the display assembly 10. The damper 170 may prevent the elastic device 150 from being damaged.

According to an embodiment, the mounting device may support the display assembly, and adjust the height of the display assembly.

According to another embodiment, it may be possible to simplify the structure of the mounding device, and to stably support the display assembly.

According to another embodiment, it may be possible to change the position of the display assembly according to the purpose of use.

According to an embodiment, it may be possible to change the mode of the display assembly and simultaneously adjust the height of the display assembly by rotating the display assembly.

Although a few embodiments have been shown and described, it will be appreciated by those having ordinary skill in the art that changes may be made in these embodiments without departing from the principles and spirit of the disclosure, the scope of which is defined in the claims and their equivalents.

What is claimed is:

1. A display apparatus comprising:
   a display assembly;
   a mounting device on which the display assembly is mounted; and
   a rotating shaft for rotating the display assembly, and disposed at a fixed position on the mounting device and the display assembly,
   wherein the display assembly is switched between a first mode and a second mode by rotating the display assembly around the rotating shaft,
   wherein the rotating shaft remains at a same position on the mounting device and a display of the display assembly when the display assembly is switched between the first mode and the second mode, and
   wherein a position of a center of the display assembly changes in a vertical direction based on the display assembly being switched between the first mode and the second mode,
   wherein the rotating shaft is biased from the center of the display assembly,
   wherein the display apparatus further comprises an elastic device configured to generate an elastic force when the display assembly rotates with respect to the rotating shaft, and
   wherein one end of the elastic device is rotatably fixed on the mounting device and the other end of the elastic device is spaced radially from the rotating shaft to be rotatably fixed on a rear surface of the display assembly.

2. The display apparatus of claim 1, wherein the rotating shaft remains in the fixed position in the first mode and in the second mode.

3. The display apparatus of claim 1, wherein the rotating shaft is spaced at a first distance from a first horizontal reference axis passing the center of the display assembly, and at a second distance from a first vertical reference axis passing the center of the display assembly, and
   wherein the first distance and the second distance are greater than zero.

4. The display apparatus of claim 3, wherein the first distance is equal to the second distance.

5. The display apparatus of claim 1, wherein the rotating shaft is spaced at a third distance from a second horizontal reference axis passing the center of the display assembly when the display assembly is in the second mode, and wherein the second horizontal reference axis is different from a first horizontal reference axis which passes the center of the display assembly when the display assembly is in the first mode.

6. The display apparatus of claim 5, wherein a first vertical reference axis passing the center of the display assembly when the display assembly is in the first mode is identical to a second vertical reference axis passing the center of the display assembly when the display assembly is in the second mode.

7. The display apparatus of claim 1, wherein the first mode is a landscape mode in which a horizontal length of the display assembly is longer than a vertical length of the display assembly, wherein the second mode is a portrait mode in which a vertical length of the display assembly is longer than a horizontal length of the display assembly, and wherein the center of the display assembly in the landscape mode is higher than the center of the display assembly in the portrait mode.

8. The display apparatus of claim 1, wherein, the elastic device is disposed in an opposite direction from the center of the display assembly with respect to a direction in which the rotating shaft is biased from the center of the display assembly.

9. The display apparatus of claim 1, wherein the elastic device is positioned:

at a first elastic position when the display assembly is in the first mode, and at a second elastic position when the display assembly is in the second mode, and wherein when the position of the elastic device changes from the first elastic position to the second elastic position, the elastic device passes through a maximum compression position at which the elastic device is compressed to a maximum.

10. The display apparatus of claim 9, further comprising a damper disposed on a path along which the elastic device moves from the maximum compression position to the second elastic position.

11. The display apparatus of claim 1, wherein the elastic device is at least one of a gas spring, a hydraulic spring, and a coil spring.

12. A display apparatus comprising:

a mounting device; and a display assembly mounted on the mounting device, and configured to be switched between a first mode and a second mode by being rotated around a rotating shaft, wherein the rotating shaft remains at a same position on the mounting device and a display of the display assembly when the display assembly is switched between the first mode and the second mode, and wherein the rotating shaft is biased in a horizontal direction and a vertical direction from a center of the display assembly, wherein the display apparatus further comprises:

an elastic device configured to generate an elastic force when the display assembly rotates with respect to the rotating shaft, wherein one end of the elastic device is rotatably fixed on the mounting device and the other end of the elastic device is rotatably fixed on a rear surface of the display assembly to be adjacent to the rotating shaft.

13. The display apparatus of claim 12, wherein a position of the rotating shaft in the first mode is identical to a position of the rotating shaft in the second mode.

14. The display apparatus of claim 12, wherein the rotating shaft is spaced at a first distance from a first horizontal reference axis passing the center of the display assembly and at a second distance from a first vertical reference axis passing the center of the display assembly.

15. The display apparatus of claim 14, wherein the first distance is equal to the second distance.

16. A display apparatus comprising:

a mounting device; and a display assembly mounted on the mounting device, and configured to be switched between a first mode and a second mode by being rotated around a rotating shaft, wherein the display assembly is switched between the first mode and the second mode and a position of a center of the display assembly changes in a vertical direction, by rotating the display assembly around the rotating shaft, and wherein the rotating shaft remains at a same position on the mounting device and a display of the display assembly when the display assembly is switched between the first mode and the second mode, wherein the rotating shaft is biased from the center of the display assembly, wherein the display apparatus further comprises an elastic device configured to generate an elastic force when the display assembly rotates with respect to the rotating shaft, and wherein one end of the elastic device is rotatably fixed on the mounting device and the other end of the elastic device is spaced radially from the rotating shaft to be rotatably fixed on a rear surface of the display assembly.

* * * * *